United States Patent [19]

Slingerland

[11] Patent Number: 5,111,054
[45] Date of Patent: May 5, 1992

[54] HEAT-ACTUATED VACUUM VALVE FOR A PARTICLE BEAM APPARATUS

[75] Inventor: Hendrik N. Slingerland, Eindhoven, Netherlands

[73] Assignee: U.S. Philips Corp., New York, N.Y.

[21] Appl. No.: 638,226

[22] Filed: Jan. 4, 1991

[30] Foreign Application Priority Data

Jan. 10, 1990 [NL] Netherlands ............... 9000057

[51] Int. Cl.$^5$ .................................. H01J 37/18
[52] U.S. Cl. .................... 250/441.11; 313/7
[58] Field of Search .......... 250/441.1, 289; 251/11; 313/7, 545, 552

[56] References Cited

U.S. PATENT DOCUMENTS

| | | | |
|---|---|---|---|
| 4,833,362 | 5/1989 | Crewe | 313/7 |
| 4,958,801 | 9/1990 | Shopsky | 251/11 |
| 4,973,024 | 11/1990 | Homma | 251/11 |

FOREIGN PATENT DOCUMENTS 57-134078  8/1982  Japan .

Primary Examiner—Jack I. Berman
Attorney, Agent, or Firm—William L. Botjer

[57] ABSTRACT

A heat-actuated valve is inserted between a first vacuum space and a further vacuum space in a particle beam apparatus. The valve is preferably activatable by the temperature required for evacuating first vacuum chamber by heating. Preferably, the valve device itself is also evacuatable by heating; this can be readily realized by avoiding the use of non-metal valve members when the valve is inserted between two spaces wherebetween a compartively small absolute difference in pressure exists, in the closed condition of the valve.

4 Claims, 1 Drawing Sheet

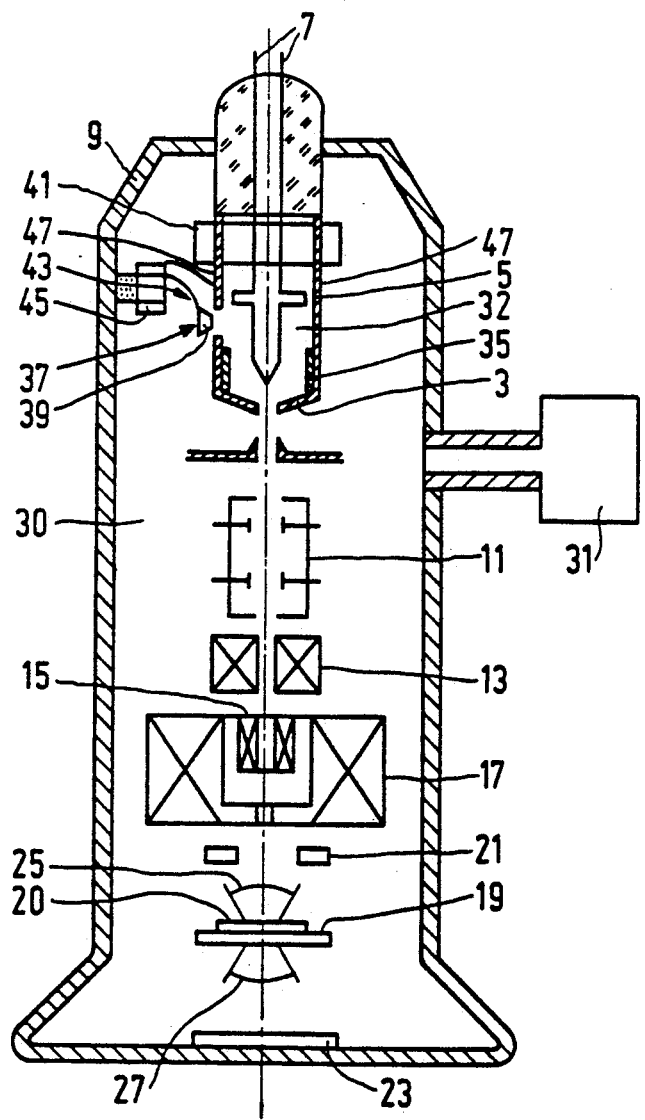

HEAT-ACTUATED VACUUM VALVE FOR A PARTICLE BEAM APPARATUS

BACKGROUND OF THE INVENTION

The invention relates to a particle beam apparatus comprising a vacuum chamber which is provided with an aperture that can be closed and which can be evacuated by heating.

Such an apparatus in the form of an electron beam apparatus is known from WO 88/080. The apparatus described therein includes a field emission source which is accommodated in a chamber which can be evacuated to a pressure of, for example $10^{-9}$ torr. Via an aperture which can be closed by means of a valve, the chamber communicates with a further apparatus chamber which is also to be evacuated, for example a working space for the electron beam. In such a space such a high vacuum is usually difficult to achieve. During a first phase of the evacuation of the high vacuum chamber the valve is open and during a further phase it is closed. The final evacuation process can be realized, for example by a getter. Opening and closing of the valve is coupled to controlled displacement of a support for the electron emitter, leading to the open and closed state of the valve. Such valve control is comparatively complex, is dependent on another member to be displaced, and can readily give rise to an undesirable state so that either evacuation is not effective or the vacuum in the high vacuum chamber is lost at an undesirable instant.

SUMMARY OF THE INVENTION

It is an object of the invention to mitigate these drawbacks; to achieve this, an apparatus of the kind set forth in accordance with the invention is characterized as described in the principal claim.

Because a valve in an apparatus in accordance with the invention can be thermally controlled, control can be readily achieved and hence also readily automatically performed. For example, the valve may occupy an open position during the evacuation of a vacuum chamber by heating, which chamber is customarily also evacuated by pumping during the evacuation by heating. Upon cooling, after the evacuation by heating, the valve may then automatically close. Preferably, a valve device can be evacuated by heating, to a customary evacuation temperature, without giving rise to detrimental deformation or thermal hysteresis, the valve assuming the closed state at the operating temperature of the apparatus. A valve device in accordance with the invention is particularly suitable for use between a high vacuum chamber and a further vacuum space wherebetween an open differential pump diaphragm is present during operation of the apparatus. Thus, in the open state of the valve a large leak for quick evacuation is realized, and when the valve is closed only such a small leak remains that an adequate low pressure can be sustained, for example by means of a getter pumping device.

A preferred embodiment of the valve device comprises a thermally activatable bending, compression or tensile spring which assumes such a length or shape beyond a temperature of, for example 150° C., that the valve is opened. To this end, the valve device may comprise a bimetal element or a temperature-sensitive storage material.

The valve in a preferred embodiment is arranged between two spaces to be conditioned, a first space being, for example a high vacuum chamber that can be closed, for example for an electron emitter or ion emitter, the second space being, for example a measuring space in the apparatus or an evacuation chamber to a pumping device.

When the valve is arranged between two spaces wherebetween ultimately a comparatively small absolute pressure difference exists, such a valve need not be provided with a seal. Slight leakage is then permissible and hence the closing force need not be large. For better closing a seal may be added to the valve and, for example use can also be made of a heat actuated relay whereby a stronger closing force can be produced. Instead of using the variation of ambient temperature which occurs in any case, use can also be made of a heating element which can be independently controlled or which may be coupled to the control of other components such as a pumping device.

BRIEF DESCRIPTION OF THE DRAWINGS

Some preferred embodiments will be described in detail hereinafter with reference to the drawing. The sole FIGURE of the drawing shows an apparatus comprising a high vacuum chamber in accordance with the invention which can be closed.

DETAILED DESCRIPTION OF THE PREFERRED EMBODIMENTS

An electron beam apparatus as diagrammatically shown comprises a cathode 1, for example a field emission point, which is accommodated, together with a control grid, in a cathode housing 5 which comprises supply leads 7 and which is preferably mounted so as to be exchangeable in an envelope 9 of the electron beam apparatus 10. The drawing also shows a beam blanking device 11 of the apparatus, as well as a beam scanning system 13, a beam alignment system 15, an objective lens 17, an object carrier 19 with an object 20, and detectors 21 and 23. The detectors 21 are capable of detecting reflected radiation 25, for example secondary electrons, X-rays generated in the object, or light generated in the object. The detector 23 is capable of detecting electrons 27 transmitted by the object. During operation of the apparatus, a pressure of, for example from $10^{-5}$ to $10^{-6}$ torr prevails in a space 30 within the envelope 9, which pressure is sustained by a pumping device 31. Such a pressure is usually too high for various electron emitters, such as a field emission source, a p-n semiconductor emitter and the like, so that the service life of the emitter is substantially reduced. Therefore, a higher vacuum is desirable in a space 32 within the cathode housing 5. This can be achieved by means of an additional pumping device, for example in the form of a preferably regenerable getter 35 accommodated in the cathode housing. Usually a substantial pressure increase occurs in the space when the object is exchanged. Using a valve device 37 in accordance with the invention, propagation of the pressure increase to the cathode chamber can be prevented. When the object is exchanged, a valve 39 of the valve device will, therefore, be closed; during a subsequent evacuation of the cathode space by heating it will be open, and during operation of the apparatus it will preferably be closed again. When a heat-actuated valve device is used, these requirements can be satisfied in that the valve device closes automatically only in the case of an increased temperature. For the evacuation of the cathode housing by heating, for example a heating device 41 is arranged around the cathode housing. When the heating device is activated, a temperature-sensitive element 43 of the valve device is also heated, so that the valve is opened. Alternatively, an additional element 45 may be added to the heating device for more direct heating of the temperature-sensitive element 43. The additional heating element may also be constructed so as to be separately controllable. In the case of heating via the heating device 41, the valve device can be supported as desired, depending on the construction of the apparatus, by a wall 47 of the cathode housing or, as in the present case, by the envelope 9 of the apparatus. For combined heating the valve is preferably mounted on the cathode housing because the temperature-sensitive element can then be adequately heated without using an additional heating element. The choice between a tension, pressure or bending spring is determined mainly by the mounting space available for the valve. Usually the valve will not be positioned too close to lens elements, because the non-exactly defined position thereof can readily have a disturbing effect. A valve device in accordance with the invention is particularly suitable for use between a chamber in a particle beam apparatus in which a high vacuum is desirable, for example a cathode chamber for a field emission source, an LA B6 electron emitter, a p-n semiconductor emitter, or an ion emitter, and a further space in the apparatus in which, for example specimen exchanges and the like take place. The high vacuum space may then remain substantially clean as a result of the closed valve, while fast evacuation is still possible in the open state of the valve. During operation of the apparatus the valve is preferably closed, notably also to counteract contamination of the high-vacuum space.

I claim:

1. A particle beam apparatus comprising a vacuum chamber which is provided with an aperture that can be closed and which can be evacuated by heating, characterized in that said aperture is provided with a heat-actuated valve device having an activation temperature which corresponds substantially to the heating temperature for the evacuation of vacuum space.

2. A particle beam apparatus as claimed in claim 1, characterized in that the valve comprises a thermally operable tension spring or bending spring.

3. A particle beam apparatus as claimed in claim 1, characterized in that a thermally controllable element of the valve contains a bimetal element.

4. A particle beam apparatus as claimed in claim 1, characterized in that a thermally controllable element of the valve contains a temperature-sensitive storage material.

* * * * *